United States Patent
Hayakawa

(10) Patent No.: US 11,456,761 B2
(45) Date of Patent: Sep. 27, 2022

(54) RADIO-FREQUENCY MODULE AND COMMUNICATION DEVICE

(71) Applicant: Murata Manufacturing Co., Ltd., Nagaokakyo (JP)

(72) Inventor: Masashi Hayakawa, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 17/242,320

(22) Filed: Apr. 28, 2021

(65) Prior Publication Data

US 2021/0384927 A1    Dec. 9, 2021

(30) Foreign Application Priority Data

Jun. 9, 2020  (JP) .............................. JP2020-100323

(51) Int. Cl.
| | |
|---|---|
| *H04B 1/04* | (2006.01) |
| *H03F 3/24* | (2006.01) |
| *H01Q 1/22* | (2006.01) |
| *H05K 1/02* | (2006.01) |
| *H05K 1/11* | (2006.01) |

(52) U.S. Cl.
CPC ............. *H04B 1/04* (2013.01); *H01Q 1/2283* (2013.01); *H03F 3/245* (2013.01); *H05K 1/0243* (2013.01); *H05K 1/11* (2013.01); *H03F 2200/451* (2013.01); *H05K 2201/10545* (2013.01)

(58) Field of Classification Search
None
See application file for complete search history.

(56) References Cited

U.S. PATENT DOCUMENTS

| | | | | |
|---|---|---|---|---|
| 2006/0276157 | A1* | 12/2006 | Chen | .................... H01Q 1/2283 455/333 |
| 2015/0119102 | A1* | 4/2015 | Saji | .................... H01L 23/5384 455/550.1 |
| 2020/0251459 | A1* | 8/2020 | Tsuda | .................... H01L 23/552 |
| 2021/0335734 | A1* | 10/2021 | You | .................... H01Q 1/2283 |
| 2021/0384927 | A1* | 12/2021 | Hayakawa | ........... H05K 1/0243 |

FOREIGN PATENT DOCUMENTS

| | | | | | |
|---|---|---|---|---|---|
| CN | 102651393 | A | * | 8/2012 | ......... H01L 29/0619 |
| CN | 111279469 | A | * | 6/2020 | ........... H01L 23/053 |
| JP | 2013-74049 | A | | 4/2013 | |
| JP | 2015-159258 | A | | 9/2015 | |
| KR | 20220010016 | A | * | 1/2022 | ............... H04B 1/50 |
| WO | WO-2015029680 | A1 | * | 3/2015 | ............... H01P 1/36 |

* cited by examiner

*Primary Examiner* — Pablo N Tran
(74) *Attorney, Agent, or Firm* — Xsensus LLP

(57) ABSTRACT

Provided is a radio-frequency module that includes a module substrate having first and second main surfaces on opposite sides of the module substrate, a resin member that covers the second main surface and includes a first groove and the second groove, a plurality of post electrodes that include a first post electrode and the second post electrode, that are arranged on the second main surface, and that penetrate through the resin member, and a semiconductor component that is arranged between the first post electrode and the second post electrode on the second main surface and that includes a surface that is not covered by the resin member. The first groove is arranged between the first post electrode and the semiconductor component. The second groove is arranged between the second post electrode and the semiconductor component.

20 Claims, 5 Drawing Sheets

RADIO-FREQUENCY MODULE AND COMMUNICATION DEVICE

CROSS-REFERENCE TO RELATED APPLICATION

The present application claims priority to Japanese patent application JP2020-100323, filed Jun. 9, 2020, the entire contents of which being incorporated herein by reference.

BACKGROUND

1. Field of the Disclosure

The present disclosure relates to a radio-frequency module and a communication device.

2. Description of the Related Art

In mobile communication devices such as mobile phones, the arrangement configurations of circuit components forming radio-frequency front end modules have been becoming increasingly complex, particularly with the development of multiband technologies.

Japanese Unexamined Patent Application Publication No. 2013-074049 discloses a built-in-component substrate that includes a resin layer that is arranged on one main surface of a substrate so as to cover electronic components mounted on the one main surface of the substrate.

In this type of built-in-component substrate, breaking of bonding parts between the built-in-component substrate and a mother board under temperature cycling on board (TCoB) conditions is an issue.

SUMMARY

Accordingly, the present disclosure is directed to a radio-frequency module and a communication device that can realize improved reliability under TCoB conditions.

A radio-frequency module according to an aspect of the present disclosure includes: a module substrate having a first main surface and a second main surface, which are on opposite sides of the module substrate; a resin member that covers the second main surface and includes a first recess and a second recess; a plurality of external connection terminals that include a first external connection terminal and a second external connection terminal, that are arranged on the second main surface, and that penetrate through the resin member; and a semiconductor component that is arranged between the first external connection terminal and the second external connection terminal on the second main surface and includes a surface that is not covered by the resin member. The first recess is arranged between the first external connection terminal and the semiconductor component, and the second recess is arranged between the second external connection terminal and the semiconductor component.

The radio-frequency module according to the aspect of the present disclosure can realize improved reliability under TCoB conditions.

Other features, elements, characteristics and advantages of the present disclosure will become more apparent from the following detailed description of preferred embodiments of the present disclosure with reference to the attached drawings.

DETAILED DESCRIPTION

Figure 1:
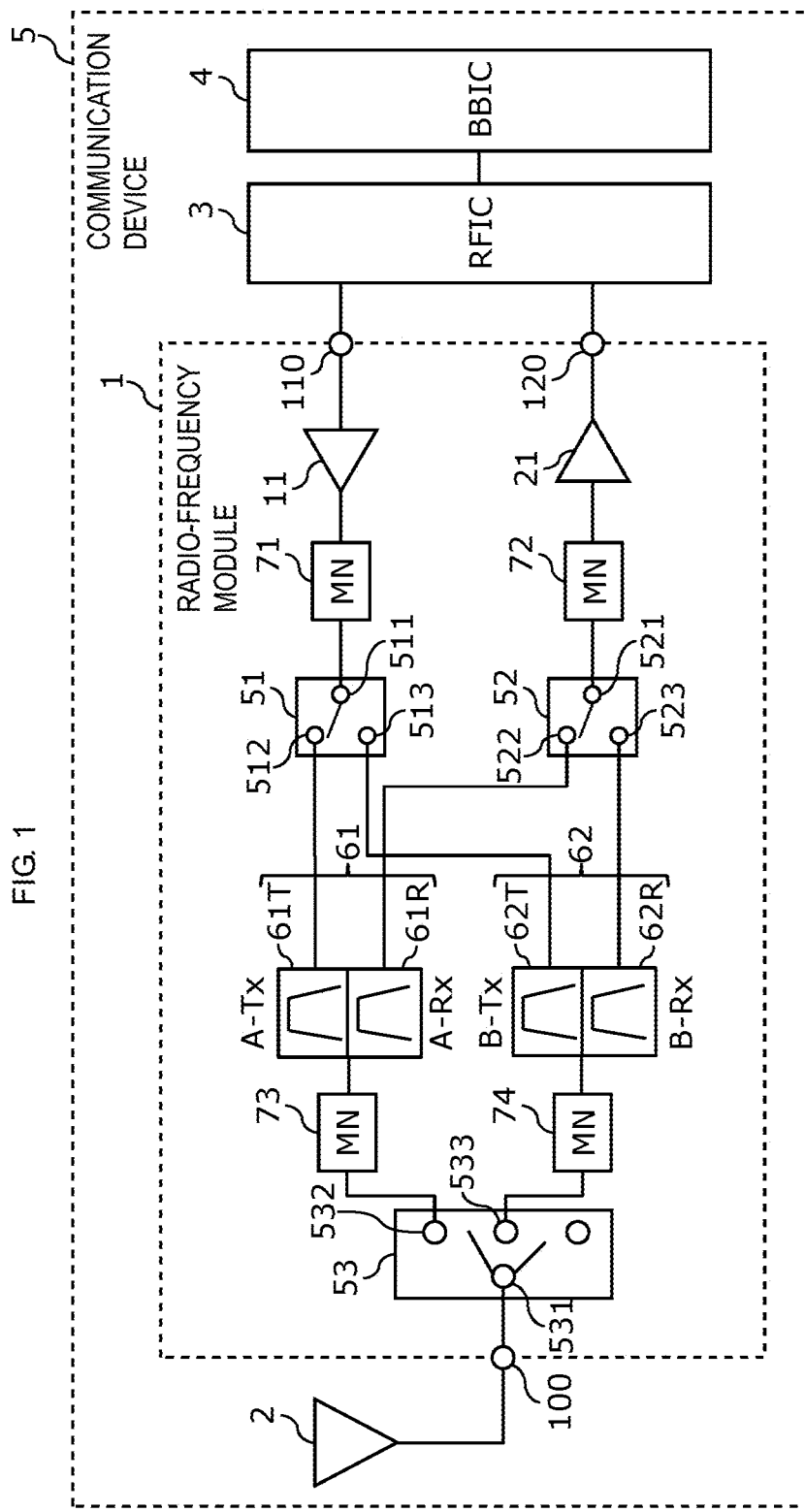
FIG. 1 is a circuit configuration diagram of a radio-frequency module and a communication device according to an embodiment.

Hereafter, embodiments of the present disclosure will be described in detail using the drawings. The embodiments described hereafter each illustrate a comprehensive or specific example of the present disclosure. The numerical values, shapes, materials, constituent elements, arrangements of the constituent elements, the ways in which the constituent elements are connected, and so forth described in the following embodiments are merely examples and are not intended to limit the present disclosure.

The drawings are schematic diagrams in which certain elements are emphasized or omitted or their proportions are adjusted as appropriate in order to illustrate the present disclosure, the drawings are not necessarily illustrated in a strictly accurate manner, and the actual shapes, positional relationships, and proportions may be different. In the drawings, configurations that are substantially the same as each other may be denoted by the same symbols and repeated description thereof may be omitted or simplified.

In the drawings referred to below, an x axis and a y axis are axes that are perpendicular to each other on a plane that is parallel to main surfaces of a module substrate. In addition, a z axis is an axis that is perpendicular to the main surfaces of the module substrate, and a positive z axis direction indicates an upward direction and a negative z axis direction indicates a downward direction.

In addition, in the circuit configurations of the present disclosure, the meaning of "connected" includes not only direct connections with connection terminals and/or wiring conductors, but also electrical connections realized via other circuit elements. Furthermore, "connected between A and B" means connected to both A and B between A and B.

In addition, with respect to arrangement of components in the present disclosure, "a plan view of the module substrate" refers to objects being viewed from the positive z-axis side as orthographic projections onto the xy-plane. In addition, "A is arranged between B and C" means that at least one of a plurality of line segments connecting any point inside B and any point inside C passes through A. In addition, terms that indicate relationships between elements, such as "parallel" and "perpendicular," are not intended to express only a strict meaning, but are also intended to include substantially equivalent ranges that include, for example, differences on the order of a few percent.

Embodiment

1.1 Circuit Configurations of Radio-Frequency Module and Communication Device First, the circuit configurations of a radio-frequency module 1 and a communication device 5 according to this embodiment will be described while referring to FIG. 1. FIG. 1 is a circuit configuration diagram of the radio-frequency module 1 and the communication device 5 according to the embodiment.

1.1.1 Circuit Configuration of Communication Device

First, the circuit configuration of the communication device 5 will be described. As illustrated in FIG. 1, the communication device 5 according to this embodiment includes a radio-frequency module 1, an antenna 2, an RFIC 3, and a BBIC 4.

The radio-frequency module 1 transmits radio-frequency signals between the antenna 2 and the RFIC 3. The detailed circuit configuration of the radio-frequency module 1 will be described later.

The antenna element 2 is connected to an antenna connection terminal 100 of the radio-frequency module 1 and transmits a radio-frequency signal output from the radio-frequency module 1 and receives a radio-frequency signal from the outside and outputs the received radio-frequency signal to the radio-frequency module 1.

The RFIC 3 is an example of a signal processing circuit that processes radio-frequency signals. Specifically, the RFIC 3 subjects a radio-frequency reception signal input thereto via a reception path of the radio-frequency module 1 to signal processing using down conversion and so forth and outputs a reception signal generated through this signal processing to the BBIC 4. In addition, the RFIC 3 subjects a transmission signal input thereto from the BBIC 4 to signal processing using up conversion and so forth and outputs a radio-frequency transmission signal generated through this signal processing to a transmission path of the radio-frequency module 1. In addition, the RFIC 3 includes a control unit that controls switches, amplifiers, and so forth of the radio-frequency module 1. Some or all of the functions of the control unit of the RFIC 3 may be implemented outside the RFIC 3, for example, in the BBIC 4 or the radio-frequency module 1.

The BBIC 4 is a base band signal processing circuit that performs signal processing using an intermediate frequency band located at a lower frequency than radio-frequency signals that are transmitted by the radio-frequency module 1. A signal processed by the BBIC 4 is used as an image signal for image display and/or as an audio signal for a telephone call via a speaker, for example.

The antenna element 2 and the BBIC 4 are not essential constituent elements of the communication device 5 according to this embodiment.

1.1.2 Circuit Configuration of Radio-Frequency Module

Next, the circuit configuration of the radio-frequency module 1 will be described. As illustrated in FIG. 1, the radio-frequency module 1 includes a power amplifier 11, a low-noise amplifier 21, switches 51 to 53, duplexers 61 and 62, matching networks (MN) 71 to 74, the antenna connection terminal 100, a radio-frequency input terminal 110, and a radio-frequency output terminal 120.

The antenna connection terminal 100 is an example of an external connection terminal and is connected to the antenna 2.

The radio-frequency input terminal 110 is an example of an external connection terminal and is a terminal for receiving a radio-frequency transmission signal from outside the radio-frequency module 1. In this embodiment, the radio-frequency input terminal 110 transmits transmission signals of communication bands A and B to the radio-frequency module 1 from the RFIC 3.

"Communication bands" refers to frequency bands predefined by a standardization organization (e.g., third Generation Partnership Project (3GPP), Institute of Electrical and Electronics Engineers (IEEE), and so on) for communication systems. "Communication system" refers to a communication system constructed using radio access technology (RAT). In this embodiment, for example, the fifth generation new radio (5GNR) system, the long term evolution (LTE) system, and the wireless local area network (WLAN) system can be used as a communication system, but the communication system is not limited to these examples.

The radio-frequency output terminal 120 is an example of an external connection terminal and is a terminal for supplying a radio-frequency reception signal to outside the radio-frequency module 1. In this embodiment, the radio-frequency output terminal 120 transmits reception signals of communication band A and communication band B to the RFIC 3 from the radio-frequency module 1.

The power amplifier 11 can amplify a radio-frequency signal received by the radio-frequency input terminal 110. In this case, the power amplifier 11 can amplify radio-frequency signals of the communication bands A and B input from the radio-frequency input terminal 110. The power amplifier 11 may, for example, be a multistage amplifier and/or an amplifier that converts signals into a differential signal and then amplifies the differential signal, but is not limited to these types of amplifiers.

The low-noise amplifier 21 can amplify a radio-frequency signal received by the antenna connection terminal 100. In this case, the low-noise amplifier 21 can amplify reception signals of communication bands A and B input from the antenna connection terminal 100 via the switch 53, the duplexers 61 and 62, and the switch 52. A radio-frequency signal amplified by the low-noise amplifier 21 is output to the radio-frequency output terminal 120. The low-noise amplifier 21 may, for example, be a multistage amplifier and/or an amplifier that converts signals into a differential signal and then amplifies the differential signal, but is not limited to these types of amplifiers.

The duplexer 61 allows radio-frequency signals of communication band A to pass therethrough. The duplexer 61 transmits a transmission signal and a reception signal of communication band A using a frequency division duplex (FDD) method. The duplexer 61 includes a transmission filter 61T (A-Tx) and a reception filter 61R (A-Rx).

The transmission filter 61T is connected between the power amplifier 11 and the antenna connection terminal 100. The transmission filter 61T allows a signal of a transmission band of communication band A, out of a radio-frequency transmission signal amplified by the power amplifier 11, to pass therethrough. In other words, the transmission filter 61T has a pass band that includes the transmission band of communication band A.

The reception filter 61R is connected between the low-noise amplifier 21 and the antenna connection terminal 100. The reception filter 61R allows a signal of the reception band of communication band A, out of a radio-frequency reception signal input from the antenna connection terminal 100, to pass therethrough. In other words, the reception filter 61R has a pass band that includes the reception band of communication band A.

The duplexer 62 allows radio-frequency signals of communication band B to pass therethrough. The duplexer 62 transmits a transmission signal and a reception signal of communication band B using the FDD method. The duplexer 62 includes a transmission filter 62T (B-Tx) and a reception filter 62R (B-Rx).

The transmission filter 62T is connected between the power amplifier 11 and the antenna connection terminal 100. The transmission filter 62T allows a signal of a transmission band of communication band B, out of a radio-frequency transmission signal amplified by the power amplifier 11, to pass therethrough. In other words, the transmission filter 62T has a pass band that includes the transmission band of communication band B.

The reception filter 62R is connected between the low-noise amplifier 21 and the antenna connection terminal 100. The reception filter 62R allows a signal of the reception band of communication band B, out of a radio-frequency reception signal input from the antenna connection terminal 100, to pass therethrough. In other words, the reception filter 62R has a pass band that includes the reception band of communication band B.

The switch 51 is connected between the transmission filters 61T and 62T and the power amplifier 11. Specifically, the switch 51 has a terminal 511, a terminal 512, and a terminal 513. The terminal 511 is connected to the power amplifier 11 via the matching network 71. The terminal 512 and the terminal 513 are respectively connected to the transmission filters 61T and 62T. In this connection configuration, the switch 51 can connect either the terminal 512 or the terminal 513 to the terminal 511 on the basis of a control signal from the RFIC 3, for example. In other words, the switch 51 can switch between connecting the power amplifier 11 and the transmission filter 61T to each other and connecting the power amplifier 11 and the transmission filter 62T to each other. The switch 51 is, for example, formed of single pole double throw switch circuit and is called a band select switch.

The switch 52 is connected between the reception filters 61R and 62R and the low-noise amplifier 21. Specifically, the switch 52 has a terminal 521, a terminal 522, and a terminal 523. The terminal 521 is connected to the low-noise amplifier 21 via the matching network 72. The terminal 522 and the terminal 523 are respectively connected to the reception filters 61R and 62R. In this connection configuration, the switch 52 can connect either the terminal 522 or the terminal 523 to the terminal 521 on the basis of a control signal from the RFIC 3, for example. In other words, the switch 52 can switch between connecting the low-noise amplifier 21 and the reception filter 61R to each other and connecting the low-noise amplifier 21 and the reception filter 62R to each other. The switch 52 is, for example, formed of an SPDT switch circuit.

The switch 53 is connected between the antenna connection terminal 100 and the duplexers 61 and 62. Specifically, the switch 53 has a terminal 531, a terminal 532, and a terminal 533. The terminal 531 is connected to the antenna connection terminal 100. The terminal 532 is connected to the duplexer 61 via the matching network 73. The terminal 533 is connected to the duplexer 62 via the matching network 74. In this connection configuration, the switch 53 can connect either or both of the terminal 532 and the terminal 533 to the terminal 531 on the basis of a control signal from the RFIC 3, for example. In other words, the switch 53 can switch between connecting and disconnecting the antenna 2 and the duplexer 61 and can switch between connecting and disconnecting the antenna 2 and the duplexer 62. The switch 53 is, for example, formed of a multiple-connection switch circuit and is called an antenna switch.

The matching network 71 is, for example, formed of an inductor and/or a capacitor and can match the impedance between the power amplifier 11 and the transmission filters 61T and 62T. The matching network 71 is connected between the power amplifier 11 and the transmission filters 61T and 62T. Specifically, the matching network 71 is connected to an output of the power amplifier 11 and is connected to the transmission filters 61T and 62T via the switch 51.

The matching network 72 is, for example, formed of an inductor and/or a capacitor and can match the impedance between the low-noise amplifier 21 and the reception filters 61R and 62R. The matching network 72 is connected between the low-noise amplifier 21 and the reception filters 61R and 62R. Specifically, the matching network 72 is connected to an input of the low-noise amplifier 21 and is connected to the reception filters 61R and 62R via the switch 52.

The matching network 73 is, for example, formed of an inductor and/or a capacitor and can match the impedance between the antenna 2 and the duplexer 61. The matching network 73 is connected between the antenna connection terminal 100 and the duplexer 61. Specifically, the matching network 73 is connected to the duplexer 61 and is connected to the antenna connection terminal 100 via the switch 53.

The matching network 74 is, for example, formed of an inductor and/or a capacitor and can match the impedance between the antenna 2 and the duplexer 62. The matching network 74 is connected between the antenna connection terminal 100 and the duplexer 62. Specifically, the matching network 74 is connected to the duplexer 62 and is connected to the antenna connection terminal 100 via the switch 53.

Some of the circuit elements illustrated in FIG. 1 do not have to be included in the radio-frequency module 1. For example, it is sufficient that the radio-frequency module 1 include the power amplifier 11 and the low-noise amplifier 21 and does not have to include the other circuit elements.

Furthermore, in the circuit configuration of the radio-frequency module 1, transmission signals and reception signals can be communicated using an FDD method, but the circuit configuration of the radio-frequency module 1 according to this embodiment of the present disclosure is not limited to this example. For example, the radio-frequency module 1 according to the embodiment of the present disclosure may have a circuit configuration in which transmission signals and reception signals can be communicated using a time division duplex (TDD) method or may have a circuit configuration in which transmission signals and reception signals can be communicated using both an FDD method and a TDD method. In addition, the radio-frequency module according to the embodiment of the present disclosure may have a circuit configuration in which only a transmission signal or a reception signal can be transmitted.

1.2 Arrangement of Components of Radio-Frequency Module

Next, the arrangement of components of the thus-configured radio-frequency module 1 will be specifically described while referring to FIGS. 2A to 4.

Figure 2A:
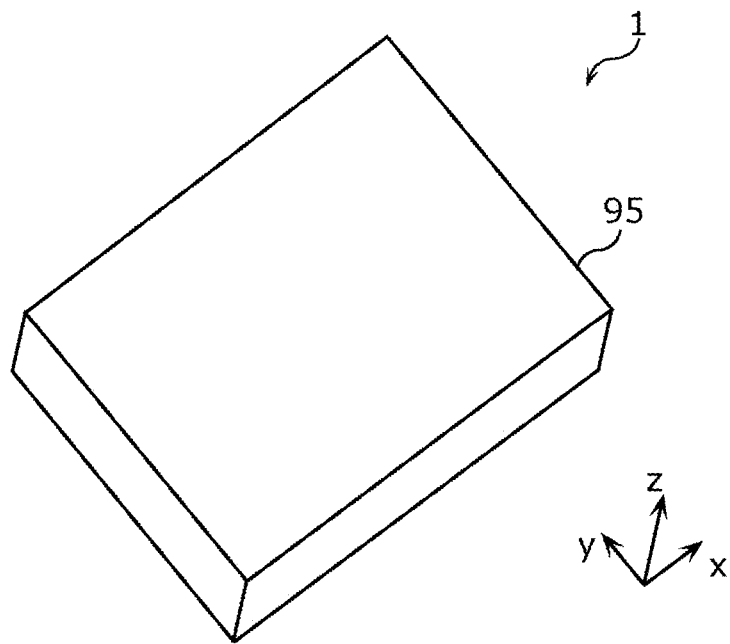
FIG. 2A is a perspective view of the radio-frequency module according to the embodiment.
Figure 2B:
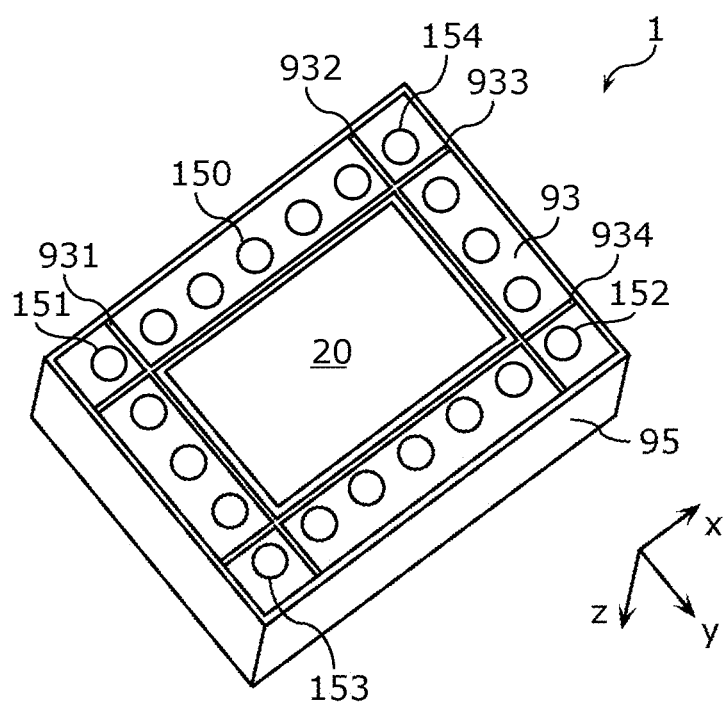
FIG. 2B is a perspective view of the radio-frequency module according to the embodiment.

FIGS. 2A and 2B are perspective views of the radio-frequency module 1 according to the embodiment. Specifically, FIG. 2A is a perspective view of the radio-frequency module 1 seen from diagonally above and FIG. 2B is a perspective view of the radio-frequency module 1 seen from diagonally below.

Figure 3A:
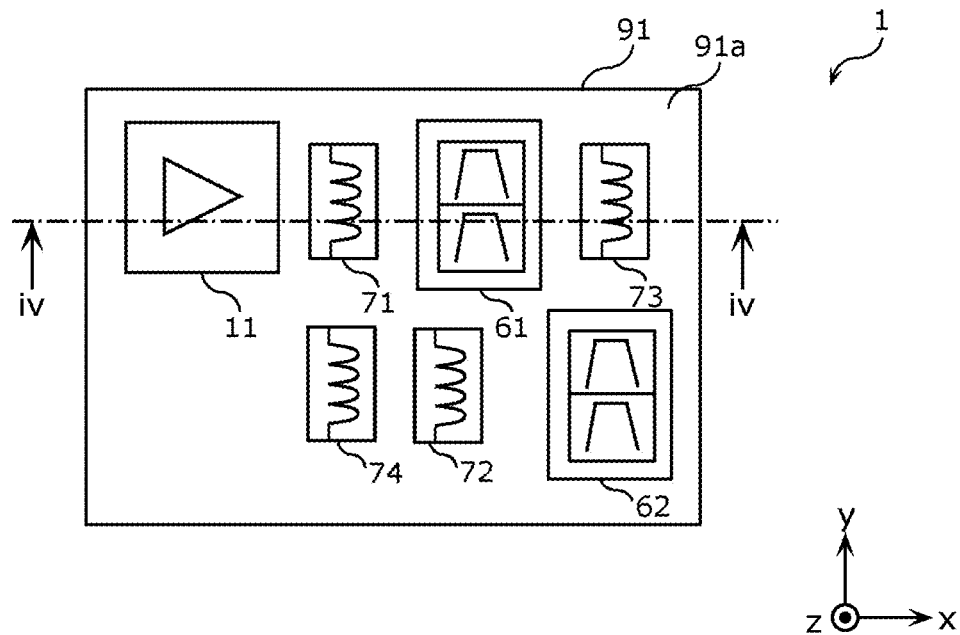
FIG. 3A is a plan view of the radio-frequency module according to the embodiment.
Figure 3B:
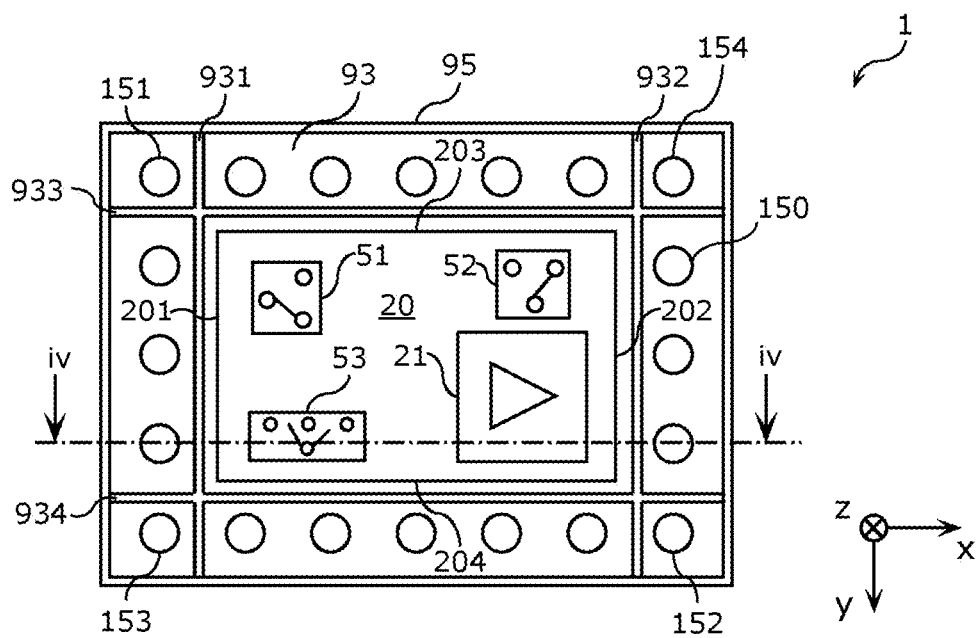
FIG. 3B is a plan view of the radio-frequency module according to the embodiment.

FIGS. 3A and 3B are plan views of the radio-frequency module 1 according to the embodiment. Specifically, FIG. 3A is a plan view of the radio-frequency module 1 viewed from above and FIG. 3B is a plan view of the radio-frequency module 1 viewed from below.

Figure 4:
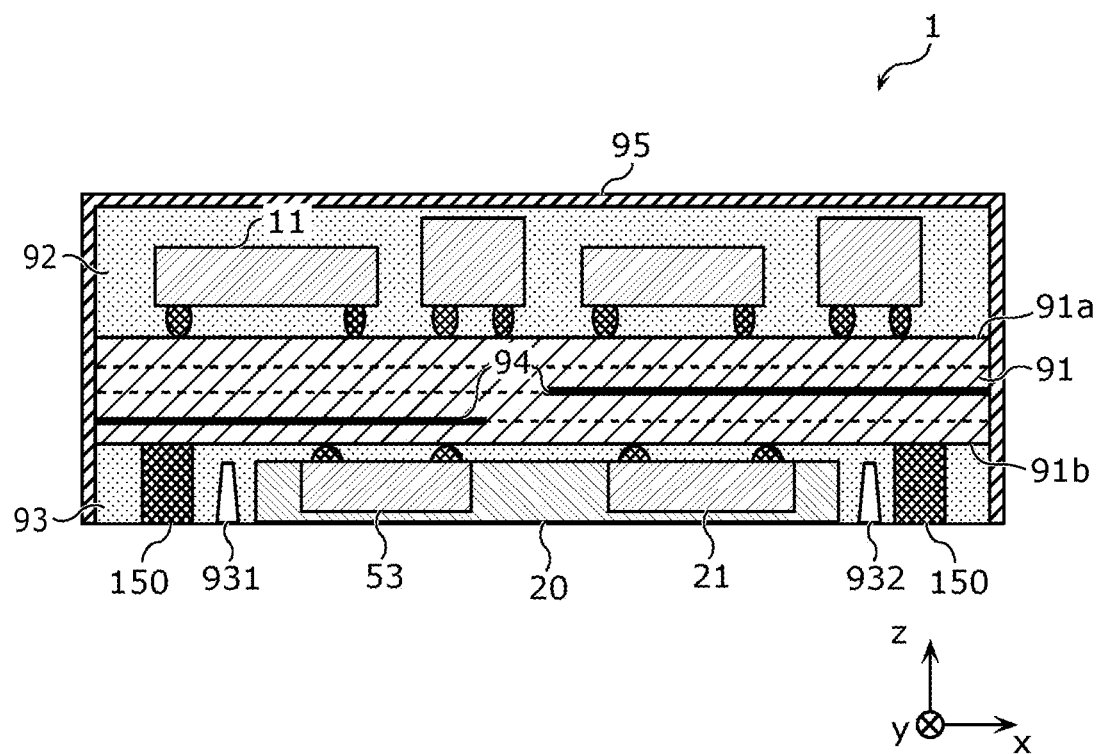
FIG. 4 is a sectional view of the radio-frequency module according to the embodiment.

FIG. 4 is a sectional view of the radio-frequency module 1 according to the embodiment. The cross section of the radio-frequency module 1 in FIG. 4 is a cross section taken along line iv-iv in FIGS. 3A and 3B.

As illustrated in FIGS. 2A to 4, in addition to the circuit components constituted by the circuit elements illustrated in FIG. 1, the radio-frequency module 1 further includes a module substrate 91, resin members 92 and 93, ground electrode patterns 94, and a shield electrode layer 95. In addition, the radio-frequency module 1 includes a plurality of post electrodes 150 as a plurality of external connection terminals. Illustration of the resin member 92 and the shield electrode layer 95 has been omitted from FIG. 3A.

The module substrate 91 has main surfaces 91a and 91b, which are on opposite sides of the module substrate. In this embodiment, the module substrate 91 is a multilayer substrate and wiring patterns including the ground electrode patterns 94 are formed thereinside. For example, a low-temperature co-fired ceramic (LTCC) substrate or a high-temperature co-fired ceramic (HTCC) substrate having a multilayer structure consisting of a plurality of dielectric layers, a built-in-component substrate, a substrate having a redistribution layer (RDL), or a printed substrate can be used as the module substrate 91, but the module substrate 91 is not limited to these examples.

The main surface 91a is an example of a first main surface and may also be referred to as an upper surface or a front surface. As illustrated in FIGS. 3A and 4, the power amplifier 11, the duplexers 61 and 62, the matching networks 71 to 74, and the resin member 92 are arranged on the main surface 91a.

The duplexers 61 and 62 may be, for example, surface acoustic wave filters, acoustic wave filters using bulk acoustic waves (BAWs), LC resonance filters, or dielectric filters, but are not restricted to these kinds of filters.

The resin member 92 is arranged on the main surface 91a of the module substrate 91 and covers the circuit components on the main surface 91a. The resin member 92 has a function of ensuring the reliability, in terms of mechanical strength, moisture resistance and so on, of the main surface 91a and the circuit components on the main surface 91a.

The main surface 91b is an example of a second main surface and may also be referred to as a lower surface or a rear surface. As illustrated in FIGS. 3B and 4, the low-noise amplifier 21, the switches 51 to 53, the resin member 93, and the plurality of post electrodes 150 are arranged on the main surface 91b.

The low-noise amplifier 21 and the switches 51 to 53 are built into a single semiconductor component 20. The semiconductor component 20 is also referred to as a semiconductor integrated circuit and is an electronic component in which electronic circuits are formed on the surface of and inside a semiconductor chip (also called a die). The semiconductor component 20 has a substantially rectangular shape consisting of first to fourth sides 201 to 204 in a plan view and a rectangular surface thereof is exposed from the resin member 93. In other words, the semiconductor component is "exposed from" the resin member 93 by having at least one surface that is not covered by the resin member 93.

Here, the first side 201 and the second side 202 face each other and the third side 203 and the fourth side 204 face each other. In other words, the third side 203 and the fourth side 204 intersect the first side 201 and the second side 202.

The semiconductor component 20 may be, for example, formed using a complementary metal oxide semiconductor (CMOS) process, and specifically may be formed using a silicon on insulator (SOI) process. This enables the semiconductor component 20 to be cheaply manufactured. The semiconductor component 20 may be formed using at least one out of GaAs, SiGe, and GaN. This enables a high-quality semiconductor component 20 to be realized.

The plurality of post electrodes 150 are an example of a plurality of external connection terminals including the antenna connection terminal 100, the radio-frequency input terminal 110, and the radio-frequency output terminal 120. The plurality of post electrodes 150 are arranged on the main surface 91b of the module substrate 91 and extend vertically from the main surface 91b. The plurality of post electrodes 150 penetrate through the resin member 93 and first ends thereof are exposed from the resin member 93. The first ends of the plurality of post electrodes 150 exposed from the resin member 93 are connected to input/output terminals and/or ground electrodes and so forth on a mother board arranged in the negative z-axis direction from the radio-frequency module 1.

Furthermore, the plurality of post electrodes 150 are arranged along the first to fourth sides 201 to 204 of the semiconductor component 20. In other words, the plurality of post electrodes 150 are arrayed along a peripheral region 912 of the semiconductor component 20. Next, regions of the main surface 91b of the module substrate 91 will be described while referring to FIG. 5.

Figure 5:
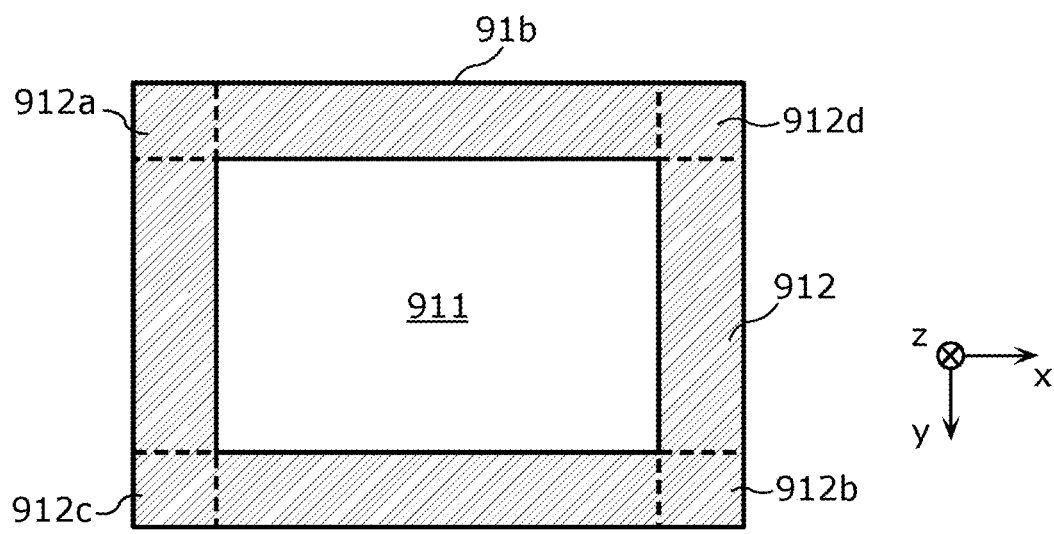
FIG. 5 is a diagram illustrating regions of a main surface of a module substrate in the embodiment.

FIG. 5 is a diagram illustrating regions of the main surface 91b of the module substrate 91 in the embodiment. The main surface 91b includes a central region 911 where the semiconductor component 20 is arranged and a peripheral region 912 where the plurality of post electrodes 150 are arranged. In FIG. 5, the peripheral region 912 is a substantially rectangular frame-shaped region, which is shaded with hatching, that surrounds the semiconductor component 20 arranged in the central region 911.

The peripheral region 912 includes first to fourth corner portions 912a to 912d located at the corners of the peripheral region 912. Here, the first corner portion 912a and the second corner portion 912b face each other and the third corner portion 912c and the fourth corner portion 912d face each other. In other words, the third corner portion 912c and the fourth corner portion 912d do not face the first corner portion 912a and do not face the second corner portion 912b. The post electrodes 150 are arranged at the first to fourth corner portions 912a to 912d. Here, the post electrodes 150 arranged at the first to fourth corner portions 912a to 912d are respectively called first to fourth post electrodes 151 to 154.

The first post electrode 151 is an example of a first external connection terminal and is arranged at the first corner portion 912a of the peripheral region 912. The second post electrode 152 is an example of a second external connection terminal and is arranged at the second corner portion 912b of the peripheral region 912. In other words, the semiconductor component 20 is arranged between the first post electrode 151 and the second post electrode 152.

The third post electrode 153 is an example of a third external connection terminal and is arranged at the third corner portion 912c of the peripheral region 912. The fourth post electrode 154 is an example of a fourth external connection terminal and is arranged at the fourth corner portion 912d of the peripheral region 912. In other words, the semiconductor component 20 is arranged between the third post electrode 153 and the fourth post electrode 154.

The resin member 93 is arranged on the main surface 91b of the module substrate 91 and covers the main surface 91b. The resin member 93 has a function of ensuring the reliability, in terms of mechanical strength, moisture resistance and so on, of the main surface 91b and the circuit components on the main surface 91b.

In this embodiment, the resin member 93 has first to fourth grooves 931 to 934 in the lower surface thereof. As illustrated in FIG. 4, the first to fourth grooves 931 to 934 each have a depth that is smaller than the thickness (length along z axis) of the resin member 93. In other words, the bottoms of the first to fourth grooves 931 to 934 do not reach the main surface 91b of the module substrate 91. This can prevent the main surface 91b of the module substrate 91 from being exposed from the resin member 93 and the main surface 91b can be protected. The first to fourth grooves 931 to 934 can be, for example, formed using laser processing or cutting. The bottoms of the first to fourth grooves 931 to 934 may instead reach the main surface 91b of the module substrate 91.

The first groove 931 extends along the first side 201 of the semiconductor component 20 and is arranged between the first post electrode 151 and the semiconductor component 20. In addition, the first groove 931 extends from one end to another end of the main surface 91b in a plan view of the module substrate 91. This allows the first groove 931 to be interposed between the first post electrode 151 and one out of two post electrodes 150 that are adjacent to the first post electrode 151. In addition, the first groove 931 is interposed between the third post electrode 153 and one out of two post electrodes 150 that are adjacent to the third post electrode 153.

The second groove 932 extends along the second side 202 of the semiconductor component 20 and is arranged between the second post electrode 152 and the semiconductor component 20. In addition, the second groove 932 extends from one end to another end of the main surface 91b in a plan view of the module substrate 91. This allows the second groove 932 to be interposed between the second post electrode 152 and one out of two post electrodes 150 that are adjacent to the second post electrode 152. Furthermore, the second groove 932 is interposed between the fourth post electrode 154 and one out of two post electrodes 150 that are adjacent to the fourth post electrode 154.

The third groove 933 extends along the third side 203 of the semiconductor component 20 and is arranged between the first post electrode 151 and the semiconductor component 20. Furthermore, the third groove 933 extends from one end to another end of the main surface 91b in a plan view of the module substrate 91. This allows the third groove 933 to be interposed between the first post electrode 151 and one out of two post electrodes 150 that are adjacent to the first post electrode 151. Furthermore, the third groove 933 is interposed between the fourth post electrode 154 and one out of two post electrodes 150 that are adjacent to the fourth post electrode 154.

The fourth groove 934 extends along the fourth side 204 of the semiconductor component 20 and is arranged between the second post electrode 152 and the semiconductor component 20. Furthermore, the fourth groove 934 extends from one end to another end of the main surface 91b in a plan view of the module substrate 91. This allows the fourth groove 934 to be interposed between the second post electrode 152 and one out of two post electrodes 150 that are adjacent to the second post electrode 152. In addition, the fourth groove 934 is interposed between the third post electrode 153 and one out of two post electrodes 150 that are adjacent to the third post electrode 153.

The shield electrode layer 95 is, for example, a thin metal film formed using a sputtering method and is formed so as to cover the upper surface and side surfaces of the resin member 92 and the side surfaces of the module substrate 91 and the resin member 93. The shield electrode layer 95 is set to the ground potential and suppresses entry of external noise into the circuit components making up the radio-frequency module 1. The radio-frequency module 1 does not have to include the shield electrode layer 95. In other words, the shield electrode layer 95 is not an essential constituent element of the radio-frequency module 1 according to the embodiment of the present disclosure.

1.3 Effects and so Forth

As described above, the radio-frequency module 1 according to this embodiment includes the module substrate 91 having the main surfaces 91a and 91b that are on opposite sides of the module substrate, the resin member 93 that covers the main surface 91b and includes the first groove 931 and the second groove 932, the plurality of post electrodes 150 that include the first post electrode 151 and the second post electrode 152, that are arranged on the main surface 91b, and that penetrate through the resin member 93, and the semiconductor component 20 that is arranged between the first post electrode 151 and the second post electrode 152 on the main surface 91b and is exposed from the resin member 93. The first groove 931 is arranged between the first post electrode 151 and the semiconductor component 20. The second groove 932 is arranged between the second post electrode 152 and the semiconductor component 20.

With this configuration, the first groove 931 and the second groove 932 are arranged between the semiconductor component 20, which is exposed from the resin member 93, and the first post electrode 151 and the second post electrode 152. Therefore, thermal stress generated due to a difference in the coefficient of linear expansion between the semiconductor component 20 and the resin member 93 can be alleviated by the first groove 931 and the second groove 932. In particular, since the first post electrode 151 and the second post electrode 152 are bonded to a mother substrate at distant positions, thermal stress tends to concentrate at the first post electrode 151 and the second post electrode 152. Therefore, the first groove 931 and the second groove 932 are able to effectively alleviate thermal stress concentrated at the first post electrode 151 and the second post electrode 152. As a result, in the radio-frequency module 1, breaking of bonding parts between the first post electrode 151 and the second post electrode 152 and the mother substrate can be reduced and reliability under TCoB conditions can be improved.

In addition, for example, in the radio-frequency module 1 according to this embodiment, the semiconductor component 20 may have, in a plan view, a substantially rectangular shape having the first side 201, the second side 202 that faces the first side 201, and the third side 203 and the fourth side 204 that intersect the first side 201. The first groove 931 may extend along the first side 201 and the second groove 932 may extend along the second side 202.

Under TCoB conditions, breaking of the bonding parts between the post electrodes and the mother substrate is often due to warping of the module substrate 91 caused by a difference in coefficient of linear expansion between the semiconductor component 20 and the resin member 93. Therefore, in the radio-frequency module 1, warping of the module substrate 91 can be reduced and reliability under TCoB conditions can be improved as a result of the first groove 931 and the second groove 932 being arranged along two opposite sides of the semiconductor component 20.

Furthermore, for example, in the radio-frequency module 1 according to this embodiment, the plurality of post electrodes 150 may be arranged along the first side 201, the second side 202, the third side 203, and the fourth side 204 of the semiconductor component 20 and the resin member 93 may further include the third groove 933 and the fourth groove 934 that respectively extend along the third side 203 and the fourth side 204.

Therefore, since the first to fourth grooves 931 to 934 are arranged along the four sides of the semiconductor component 20, warping of the module substrate 91 can be further reduced and reliability under TCoB conditions can be further improved in the radio-frequency module 1.

In addition, for example, in the radio-frequency module 1 according to this embodiment, the first post electrode 151 may be arranged at the first corner portion 912a of the substantially rectangular frame-shaped peripheral region 912 that surrounds the semiconductor component 20 and the first groove 931 and the third groove 933 may be respectively interposed between the first post electrode 151 and two post electrodes 150 that are adjacent to the first post electrode 151.

In addition, for example, in the radio-frequency module 1 according to this embodiment, the second post electrode 152 may be arranged at the second corner portion 912b, which faces the first corner portion 912a, of the peripheral region 912 and the second groove 932 and the fourth groove 934 may be respectively interposed between the second post electrode 152 and two post electrodes 150 that are adjacent to the second post electrode 152.

In addition, for example, in the radio-frequency module 1 according to this embodiment, the plurality of post electrodes 150 may include the third post electrode 153 that is arranged at the third corner portion 912c, which is one of two corner portions of the peripheral region 912 that do not face the first corner portion 912a, and the first groove 931 and the fourth groove 934 may be respectively interposed between the third post electrode 153 and two post electrodes 150 that are adjacent to the third post electrode 153.

In addition, for example, in the radio-frequency module 1 according to this embodiment, the plurality of post electrodes 150 may include the fourth post electrode 154 that is arranged at the fourth corner portion 912d, which is the other corner portion out of the two corner portions of the peripheral region 912 that do not face the first corner portion 912a, and the second groove 932 and the third groove 933 may be respectively interposed between the fourth post electrode 154 and two post electrodes 150 that are adjacent to the fourth post electrode 154.

With these configurations, at least one out of the four post electrodes (first to fourth post electrodes 151 to 154) located at the corners among the plurality of post electrodes 150 arranged along the first to fourth sides 201 to 204 of the semiconductor component 20 can be isolated from the adjacent post electrodes 150. Under TCoB conditions, thermal stress especially tends to concentrate at the post electrodes 150 located at the corners and the bonding portions at these post electrodes 150 are more likely to break. Therefore, thermal stress concentrated at the first to fourth post electrodes 151 to 154 can be effectively alleviated due to the first to fourth post electrodes 151 to 154 being isolated from each other by the first to fourth grooves 931 to 934. As a result, breaking of bonding parts between the first to fourth post electrodes 151 to 154 and the mother substrate can be reduced and reliability under TCoB conditions can be improved in the radio-frequency module 1.

Furthermore, for example, the radio-frequency module 1 according to this embodiment may further include the power amplifier 11 and the low-noise amplifier 21, the power amplifier 11 may be arranged on the main surface 91a, and the low-noise amplifier 21 may be built into the semiconductor component 20 arranged on the main surface 91b.

With this configuration, the power amplifier 11 and the low-noise amplifier 21 can be arranged on opposite surfaces of the module substrate 91 and the radio-frequency module 1 can be reduced in size while suppressing degradation of isolation characteristics of a transmission path and a reception path.

Furthermore, the communication device 5 according to this embodiment includes the RFIC 3 that processes radio-frequency signals and the radio-frequency module 1 that transmits radio-frequency signals between the RFIC 3 and the antenna 2.

With this configuration, the same effects can be realized with the communication device 5 as with the radio-frequency module 1.

Modifications

In the above embodiment, the resin member 93 has the first to fourth grooves 931 to 934 as recesses but the number and shape of the recesses is not limited to this example. It is sufficient that the number of recesses be two or more. For example, the number of recesses may be three or may be five or more. Furthermore, the recesses do not have to be grooves.

Figure 6:
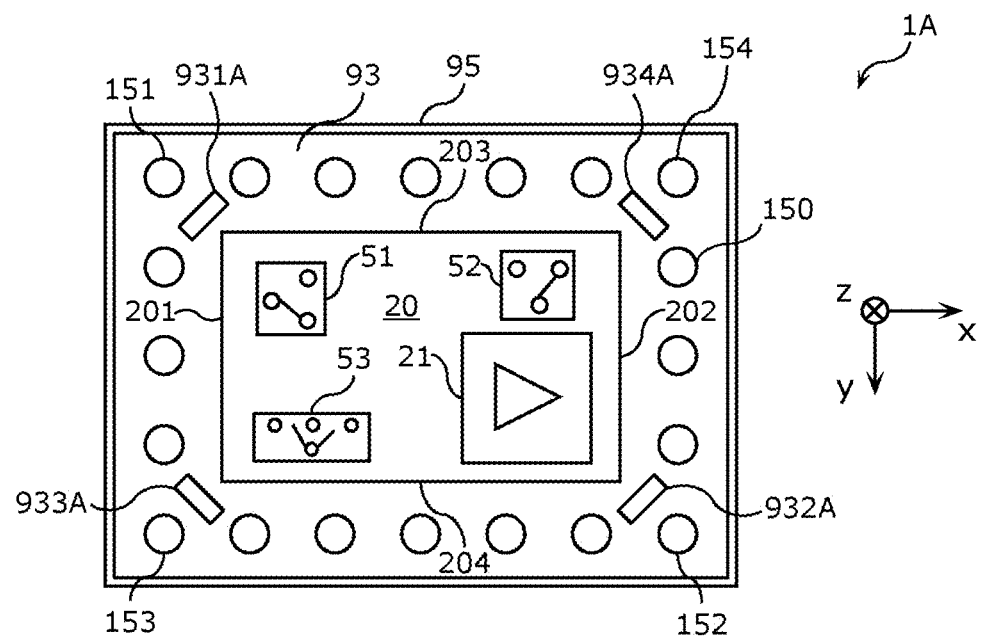
FIG. 6 is a plan view of a radio-frequency module according to a modification of the embodiment.

FIG. 6 is a plan view of a radio-frequency module 1A according to a modification of the embodiment. The resin member 93 of the radio-frequency module 1A according to this modification has first to fourth recesses 931A to 934A instead of the first to fourth grooves 931 to 934. The first recess 931A is arranged between the first post electrode 151 and the semiconductor component 20. The second recess 932A is arranged between the second post electrode 152 and the semiconductor component 20. The third recess 933A is arranged between the third post electrode 153 and the semiconductor component 20. The fourth recess 934A is arranged between the fourth post electrode 154 and the semiconductor component 20.

Also in the case where the resin member 93 has the first to fourth recesses 931A to 934A instead of the first to fourth grooves 931 to 934 as described above, the radio-frequency module 1A is able to reduce breaking of bonding parts of the first to fourth post electrodes 151 to 154 with the mother substrate and improve the reliability under TCoB conditions.

Other Modifications

The radio-frequency module and communication device according to an embodiment of the present disclosure described above have been described in the form of an embodiment and modifications of the embodiment, but a radio-frequency module and communication device according to embodiments of the present disclosure are not limited to the above-described embodiment and modifications. Other embodiments realized by combining any of the constituent elements of the above-described embodiment and modifications with one another, modifications obtained by modifying the above-described embodiment in various ways, as thought of by one skilled in the art, while not departing from the gist of the present disclosure, and various devices having the radio-frequency module and communication device built thereinto are included in the scope of the present disclosure.

For example, in the circuit configurations of the radio-frequency modules and communication devices according to the embodiment and modifications described above, other circuit elements, wiring lines, and so forth may be inserted midway along paths that connect the circuit elements and signal paths disclosed in the drawings. For example, a filter may be inserted between the antenna connection terminal 100 and the switch 53 in the above embodiment.

The arrangements of components in the above embodiments are merely examples and the arrangements are not limited to these examples. For example, the switch 51 may be arranged on the main surface 91a in the embodiment.

Post electrodes are used as external connection terminals in the above embodiments, but the external connection terminals are not limited to being post electrodes. For example, bump electrodes may be used as the external connection terminals.

The present disclosure can be widely used in communication devices such as mobile phones as a radio-frequency module that is arranged in a front end unit.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A radio-frequency module comprising:
   a module substrate having a first main surface and a second main surface on opposite sides of the module substrate;
   a resin member that covers at least a portion of the second main surface and includes a first recess and a second recess;
   a plurality of external connection terminals that include a first external connection terminal and a second external connection terminal, that are arranged on the second main surface, and that penetrate through the resin member; and
   a semiconductor component that is arranged between the first external connection terminal and the second external connection terminal on the second main surface and that includes a surface that is not covered by the resin member, wherein
   the first recess is arranged between the first external connection terminal and the semiconductor component, and
   the second recess is arranged between the second external connection terminal and the semiconductor component.

2. The radio-frequency module of claim 1, wherein
   the semiconductor component has, in a plan view, a rectangular shape having a first side, a second side that faces the first side, and a third side and a fourth side that intersect the first side.

3. The radio-frequency module of claim 2, wherein
   the first recess is a first groove that extends along the first side, and
   the second recess is a second groove that extends along the second side.

4. The radio-frequency module of claim 3, wherein
   the plurality of external connection terminals are arranged along the first side, the second side, the third side, and the fourth side of the semiconductor component.

5. The radio-frequency module of claim 4, wherein
   the resin member further includes a third groove and a fourth groove that respectively extend along the third side and the fourth side.

6. The radio-frequency module of claim 5, wherein
   the first external connection terminal is arranged at a first corner portion of a rectangular frame-shaped peripheral region surrounding the semiconductor component.

7. The radio-frequency module of claim 6, wherein
   the first groove and the third groove are respectively interposed between the first external connection terminal and two of the external connection terminals that are adjacent to the first external connection terminal.

8. The radio-frequency module of claim 7, wherein
   the second external connection terminal is arranged at a second corner portion of the peripheral region that faces the first corner portion.

9. The radio-frequency module of claim 8, wherein
   the second groove and the fourth groove are respectively interposed between the second external connection terminal and two of the external connection terminals that are adjacent to the second external connection terminal.

10. The radio-frequency module of claim 9, wherein
    the plurality of external connection terminals include a third external connection terminal that is arranged at a third corner portion that is one of two corner portions of the peripheral region that do not face the first corner portion.

11. The radio-frequency module of claim 10, wherein
    the first groove and the fourth groove are respectively interposed between the third external connection terminal and two of the external connection terminals that are adjacent to the third external connection terminal.

12. The radio-frequency module of claim 11, wherein
    the plurality of external connection terminals include a fourth external connection terminal that is arranged at a fourth corner portion that is another corner portion out of the two corner portions of the peripheral region that do not face the first corner portion.

13. The radio-frequency module of claim 12, wherein
    the second groove and the third groove are respectively interposed between the fourth external connection terminal and two of the external connection terminals that are adjacent to the fourth external connection terminal.

14. The radio-frequency module of claim 1, further comprising:
    a power amplifier arranged on the first main surface.

15. The radio frequency module of claim 14, further comprising:
    a low-noise amplifier that is built into the semiconductor component arranged on the second main surface.

16. A communication device comprising:
    a signal processing circuit that processes radio-frequency signals; and
    a radio-frequency module that transmits the radio-frequency signals between the signal processing circuit and an antenna, wherein
    the radio-frequency module includes
    a module substrate having a first main surface and a second main surface on opposite sides of the module substrate;
    a resin member that covers at least a portion of the second main surface and includes a first recess and a second recess;
    a plurality of external connection terminals that include a first external connection terminal and a second external connection terminal, that are arranged on the second main surface, and that penetrate through the resin member; and a semiconductor component that is arranged between the first external connection terminal and the second external connection terminal on the second main surface and that includes a surface that is not covered by the resin member, wherein the first recess is arranged between the first external connection terminal and the semiconductor component, and the second recess is arranged between the second external connection terminal and the semiconductor component.

17. A radio-frequency module comprising:

a module substrate having a first main surface and a second main surface on opposite sides of the module substrate;

a resin member that covers at least a portion of the second main surface and includes a first recess and a second recess;

a first external connection terminal arranged on the second main surface and that penetrates through the resin member;

a second external connection terminal arranged on the second main surface and that penetrates through the resin member;

a semiconductor component that is arranged between the first external connection terminal and the second external connection terminal on the second main surface, wherein the first recess is arranged between the first external connection terminal and the semiconductor component, and the second recess is arranged between the second external connection terminal and the semiconductor component.

18. The radio-frequency module of claim 17, wherein the semiconductor component includes a surface that is not covered by the resin member.

19. The radio-frequency module of claim 17, wherein the semiconductor component has, in a plan view, a rectangular shape having a first side, a second side that faces the first side, and a third side and a fourth side that intersect the first side, the first recess is a first groove that extends along the first side, and the second recess is a second groove that extends along the second side.

20. The radio frequency module of claim 19, wherein the resin member further includes a third groove and a fourth groove that respectively extend along the third side and the fourth side, the first external connection terminal is arranged at a first corner portion of a rectangular frame-shaped peripheral region surrounding the semiconductor component, the first groove and the third groove are respectively interposed between the first external connection terminal and two of the external connection terminals that are adjacent to the first external connection terminal, and the second external connection terminal is arranged at a second corner portion of the peripheral region that faces the first corner portion.

* * * * *